(12) United States Patent
Nikawa

(10) Patent No.: US 8,090,191 B2
(45) Date of Patent: Jan. 3, 2012

(54) METHOD AND APPARATUS FOR INSPECTION AND FAULT ANALYSIS

(75) Inventor: Kiyoshi Nikawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 795 days.

(21) Appl. No.: 12/164,594

(22) Filed: Jun. 30, 2008

(65) Prior Publication Data

US 2009/0003685 A1    Jan. 1, 2009

(30) Foreign Application Priority Data

Jun. 29, 2007 (JP) ................................. 2007-172555

(51) Int. Cl.
*G06K 9/00* (2006.01)
(52) U.S. Cl. .................... 382/149; 324/754.23
(58) Field of Classification Search .............. 382/145, 382/147, 149; 356/237.4–237.5; 324/762.01–762.1, 324/754.23

See application file for complete search history.

(56) References Cited

U.S. PATENT DOCUMENTS

| | | | |
|---|---|---|---|
| 4,812,748 A | 3/1989 | Brust et al. | |
| 4,902,966 A | 2/1990 | Brust et al. | |
| 6,028,435 A * | 2/2000 | Nikawa | 324/762.01 |
| 6,066,956 A | 5/2000 | Nikawa | |
| 6,078,183 A * | 6/2000 | Cole, Jr. | 324/754.23 |
| 6,160,407 A * | 12/2000 | Nikawa | 324/754.23 |
| 6,549,022 B1 * | 4/2003 | Cole et al. | 324/754.23 |
| 6,617,862 B1 * | 9/2003 | Bruce | 324/754.23 |
| 6,967,491 B2 * | 11/2005 | Perdu et al. | 324/754.23 |

FOREIGN PATENT DOCUMENTS

| | | |
|---|---|---|
| JP | 62-055616 | 3/1987 |
| JP | 9-145795 | 6/1997 |
| JP | 11-310266 | 11/1999 |
| JP | 2005-140759 | 6/2005 |

OTHER PUBLICATIONS

K. Morimoto et al., "LSI failure analysis using the IR-OBIRCH system" Conference minutes, LSI Testing Symposium, Nov. 4, 1999, p. 223-228.
Japanese Official Action—2007-172555—Nov. 1, 2011.

* cited by examiner

*Primary Examiner* — Kara E Geisel
(74) *Attorney, Agent, or Firm* — Young & Thompson

(57) ABSTRACT

Apparatus for inspection and fault analysis of semiconductor chip includes stage on which to mount LSI chip, and test pattern generator supplying test pattern via stage to LSI chip. Apparatus also includes optical system having function of modulating laser beam. This optical system operates so that LSI chip is scanned and illuminated by modulated laser beam. IR-OBIRCH controller performs image processing of taking out only signal of preset frequency from signal from LSI chip via lock-in amplifier, and correlates signal taken out with scanning points. Lock-in amplifier is adapted to take out only signal of preset frequency from signal from LSI chip. A display section displays image based on image signal from IR-OBIRCH controller which confirms presence or absence of abnormal current route in LSI chip based on image signal.

12 Claims, 10 Drawing Sheets

FIG.3
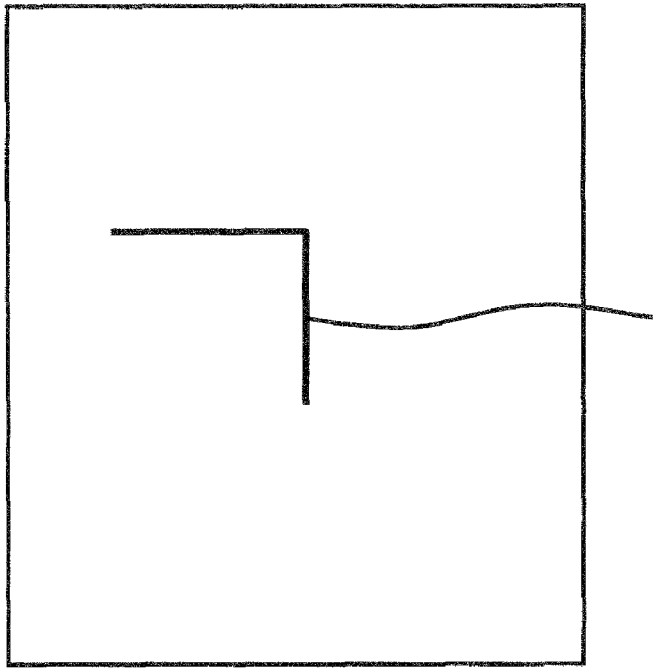
[ABNORMAL CHIP]
10; ABNORMAL CURRENT ROUTE
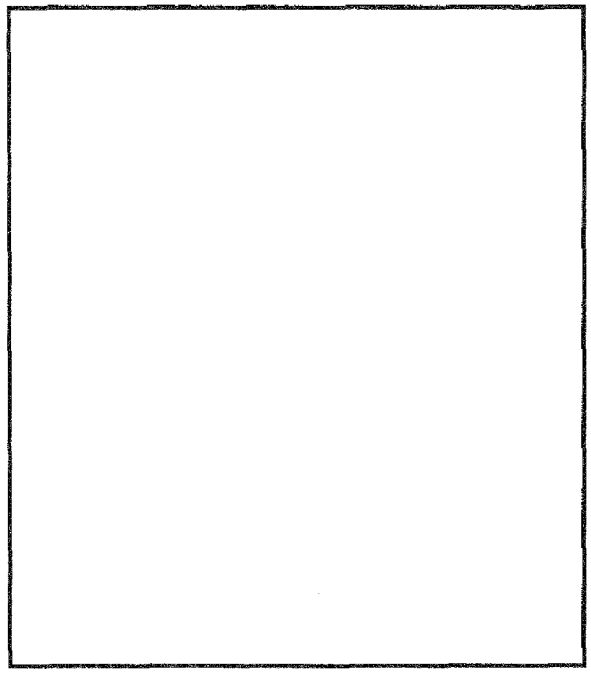
[NORMAL CHIP]

FIG.5A
IR-OBIRCH IMAGE ACQUIRED UNDER STANDARD CONDITION
[NORMAL CHIP]
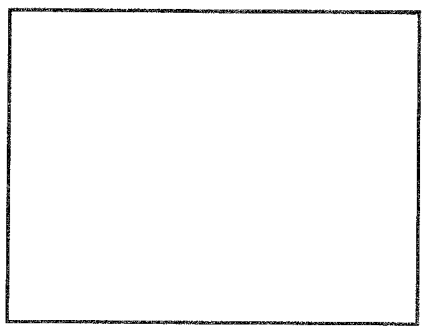
[ABNORMAL CHIP]
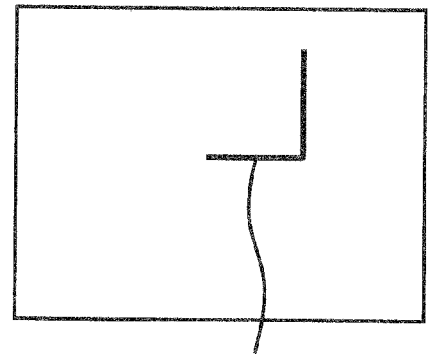
10; ABNORMAL CURRENT ROUTE
FIG.5B
IR-OBIRCH IMAGE ACQUIRED UNDER HIGH-SPEED CONDITION
[NORMAL CHIP]
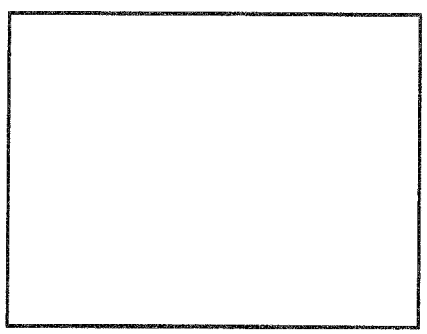
[ABNORMAL CHIP]
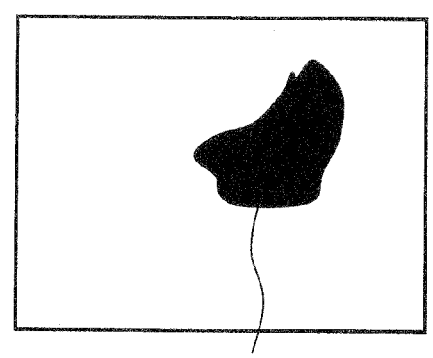
11; CONTRAST ASCRIBABLE TO ABNORMAL CURRENT ROUTE

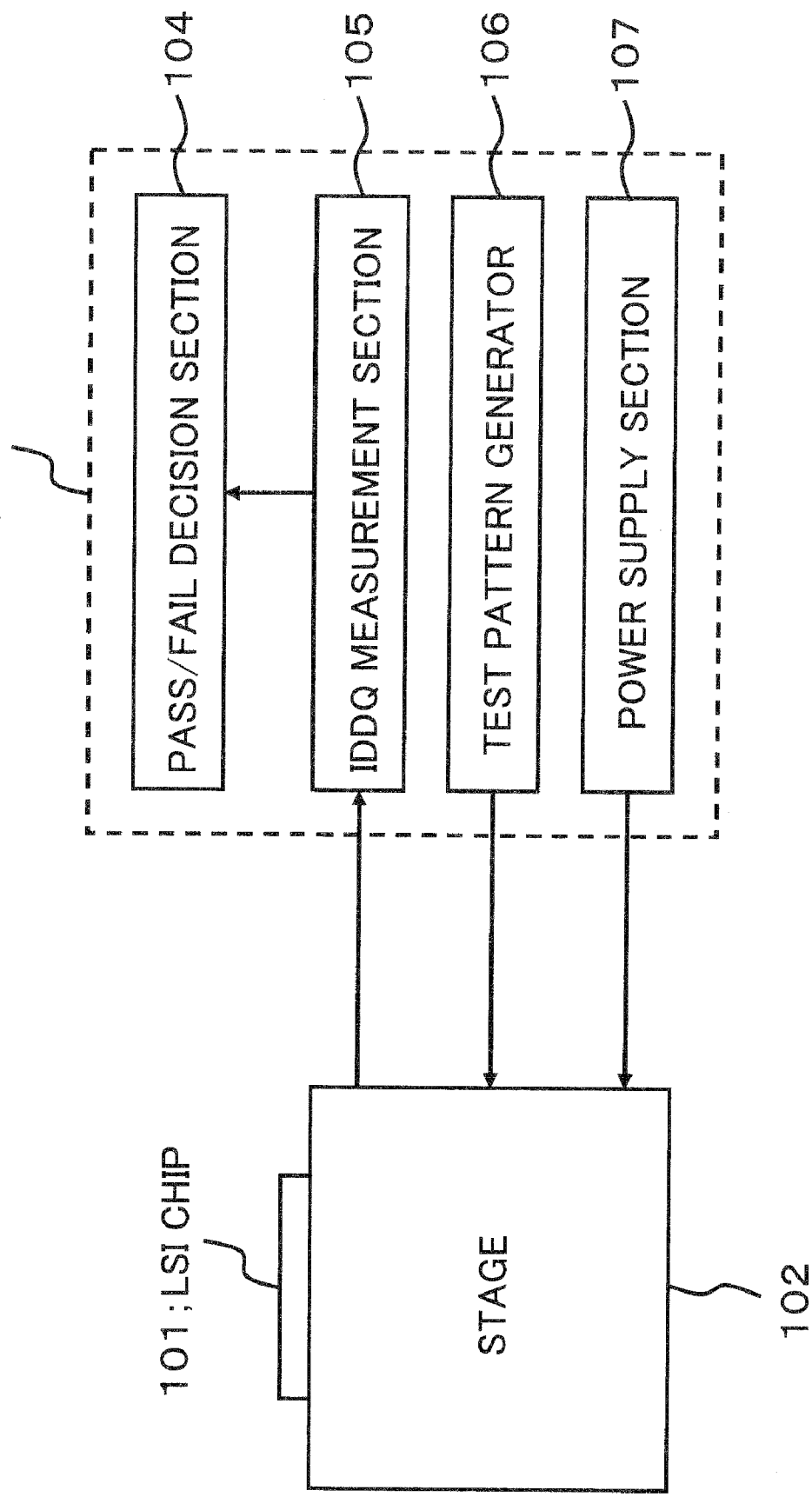

(SMALL IDDQ VALUE OF NORMAL CHIP

LARGE IDDQ VALUE OF NORMAL CHIP

METHOD AND APPARATUS FOR INSPECTION AND FAULT ANALYSIS

REFERENCE TO RELATED APPLICATION

This application is based upon and claims the benefit of the priority of Japanese patent application No. 2007-17255 filed on Jun. 29, 2007, the disclosure of which is incorporated herein in its entirety by reference thereto.

TECHNICAL FIELD

This invention relates to a method and apparatus for inspection and fault analysis of a semiconductor chip. More particularly, it relates to a method and apparatus for inspecting an LSI, detecting a defective LSI chip and for locating a defective site on the LSI chip by a non-destructive narrowing for targeting (or focusing) technique (termed "targeting narrowing technique" hereinafter).

DESCRIPTION OF RELATED ART

The methods and apparatus for inspecting a semiconductor chip, such as LSI chip, are used for detecting a defective chip in order to verify acceptability/unacceptability of a semiconductor chip. On the other hand, the methods and apparatus for fault analysis of a semiconductor chip are used to identify a defective site of a semiconductor chip, verified to be a defective chip, in order to investigate into the cause of the defect. The sequence of operations for fault analysis of a semiconductor chip is roughly classified into two steps. In a first step, possible defective sites on a semiconductor chip are non-destructively detected to a micrometer order (defective site targeting narrowing technique). The site thus found by the targeting narrowing technique is then subjected to a destructive physico-chemical analysis (physico-chemical analysis technique).

The following is a conventional technique concerning methods and apparatus for inspecting an LSI chip (related art example 1). Referring to FIGS. 6 and 7, a power supply voltage is supplied to an LSI chip 101 from a power supply section 107 of an LSI tester 103 via a stage 102 (step B1). A test pattern is then entered to the LSI chip 101, via stage 102, from a test pattern generator 106 in the LSI tester 103 (step B2). An IDDQ current value (quiescent state power supply current value) of the LSI chip 101 is measured by an IDDQ measurement section 105 of the LSI tester 103 (step B3). The measured value is compared to a reference value by a pass/fail decision section 104 of the LSI tester 103 to verify whether or not the IDDQ value is an abnormal current value (step B4). If the measured value is an abnormal value (YES of step B4), the chip being tested is recognized to be an IDDQ abnormal chip (step B5). If conversely the IDDQ value is not an abnormal value (NO of step B4), another test pattern is entered from the test pattern generator 106 via stage 102 to the LSI chip 101 (step B6) and an IDDQ value is measured by the IDDQ measurement section 105 (step B3) to repeat the steps as from the step B4.

Among the conventional techniques for methods and apparatus for fault analysis of semiconductor chips (related art example 2), there are those shown e.g. in Patent Document 1 and Non-Patent Document 1. Referring to FIGS. 9 and 10, a power supply voltage is initially applied from a power supply section 207 in an LSI tester 203 via stage 209 to an LSI chip 201 (step C1). A test pattern, verified from the outset with the related art example 1 to exhibit IDDQ abnormality, is supplied from a test pattern generator 206 in the LSI tester 203 via stage 209 to the LSI chip 201 (step C2). The IDDQ value (quiescent state power supply current value) of the LSI chip 201 is measured by an IDDQ measurement section 205 of the LSI tester 203. The measured IDDQ value is checked as to whether or not it is coincident with a value measured with the related art example 1, by way of verification of reproducibility of abnormality measurement (step C3). If the reproducibility has not been confirmed, the problem related with the LSI tester 203 or with the LSI chip 201 is first solved, after which processing is again initiated as from step C1. Meanwhile, the case where the reproducibility has been confirmed is not indicated. If conversely the reproducibility is noticed, the power supply applied to the LSI chip 201 is switched from a power supply section 207 of the LSI tester 203 to a power supply section, not shown, of an IR-OBIRCH (Infrared Optical Beam Induced Resistance Change) device 202 (step C4). The LSI chip 201 is then scanned and illuminated by a light beam 212 from an optical system 208 in the IR-OBIRCH device 202, to display an IR-OBIRCH image on an display section 211 in the IR-OBIRCH device 202, via an IR-OBIRCH controller 210 in the IR-OBIRCH device 202 (step C5). The IR-OBIRCH image, displayed on the display section 211, is visually observed to detect a route of the abnormal current or a defect (step C6). It should be noticed that the optical system 208 may be provided with the function of modulating the laser beam, while the IR-OBIRCH controller 210 may include a lock-in amplifier.

[Patent Document 1] JP Patent Kokai JP-A-11-310266
[Non-Patent Document 1] Morimoto, Noguchi, Nikawa and Inoue, 'Instances of Fault Analyses of LSIs using an IR-OBIRCH system', Conference minutes, LSI Testing Symposium, Nov. 4, 1999, page 224

SUMMARY OF THE DISCLOSURE

The entire disclosures of above Patent and Non-Patent Documents are herein incorporated by reference thereto. The following analysis are given by the present invention.

If, with the method or apparatus for inspection, according to the related art example 1, an IDDQ value of a normal chip is small, an IDDQ abnormal chip may be detected by setting a reference value for an IDDQ value intermediate between the IDDQ value distribution of a normal chip and that of an abnormal chip, in such a manner that the reference value belongs to neither the distribution of the normal chip nor the distribution of the abnormal chip, as shown in FIG. 8(A). However, in case of a larger IDDQ value for the normal chip, there are cases where the IDDQ value distribution of a normal chip and that of an abnormal chip overlap with each other, as shown in FIG. 8(B). This renders it difficult to set a reference value for verifying a normal/abnormal chip, and hence to detect an IDDQ abnormal chip.

With the method and apparatus for fault analysis according to the related art example 2, the step of identifying an IDDQ abnormal chip and a step of detecting an abnormal current route or a defect are carried out separately, which means a labor-consuming inefficient operation. Further, with the method and apparatus for fault analysis according to the related art example 2, it is necessary to use an expensive LSI tester, thus raising the cost.

It is a principal object of the present invention to provide a method and apparatus for inspection and fault analysis of a semiconductor chip, according to which it is possible to identify an abnormal chip even in case of larger power supply current of a normal chip.

In a first aspect according to the present invention, there is provided a method for inspection and fault analysis. The method comprises a step of delivering a test pattern as an input to a semiconductor chip, and a step of scanning and illuminating the semiconductor chip with a laser beam, at the time of delivering the test pattern as an input. Thereby the semiconductor chip is heated and the resistance changes are visualized in the semiconductor chip to generate an image. A decision is given on the presence or absence of an abnormal current route conducting an abnormal IDDQ in the semiconductor chip, based on the image obtained on visualizing the resistance changes.

In a second aspect according to the present invention, there is provided an apparatus for detection and fault analysis. The apparatus includes a stage in which a semiconductor chip is mounted thereon, and a test pattern generator that supplies a test pattern via the stage to the semiconductor chip. An optical system has a function of modulating the laser beam. This optical system operates so that the semiconductor chip is scanned and illuminated by a modulated laser beam. The apparatus according to the present invention also includes a controller for taking out a signal from the semiconductor chip through a lock-in amplifier which is configured for taking out only a signal portion of a preset frequency in a signal from the semiconductor chip. The controller performs image processing of correlating the signal portion thus taken out with scanning points. The apparatus according to the present invention further includes a display section displaying an image based on an image signal from the controller.

The meritorious effects are achieved as follows. According to the present invention, an abnormal chip may be identified even in case of a large power supply current of the normal chip. In the related art (comparative) example 1, distributed leakage current, conducted in both a normal chip and an abnormal chip, cannot be visualized, so that it is difficult to identify an IDDQ abnormal chip. With the IR-OBIRCH method, in which resistance changes in the semiconductor chip, caused by illuminating a light beam to the semiconductor chip to heat the chip, are observed, it is possible to visualize the route along which flows the current in a concentrated fashion.

Further, according to the present invention, an IR-OBIRCH image may be observed at a higher speed at the time of recognizing an abnormal LSI chip than when the normal IR-OBIRCH image is observed, with the result that the IR-OBIRCH image may be observed more efficiently than with the conventional method. Additionally, with the present invention, the LSI tester, needed with the conventional method, may be dispensed with, and an inexpensive test pattern generator may be used, with the result that the inspection may be carried out at a low cost.

BRIEF DESCRIPTION OF THE DRAWINGS

FIG. 3 is a schematic view for illustrating the operation of the apparatus for inspection and fault analysis according to the first exemplary embodiment of the present invention.

FIGS. 5(A) and 5(B) are schematic views showing IR-OBIRCH images obtained on a apparatus for inspection and fault analysis according to the second exemplary embodiment of the present invention, under a standard condition and under a high-speed condition, respectively.

FIG. 6 is a schematic block diagram schematically showing the constitution of an apparatus for inspection and fault analysis according to a related art (comparative) example 1.

DETAILED DESCRIPTION OF PREFERRED EMBODIMENTS

Figure 1:
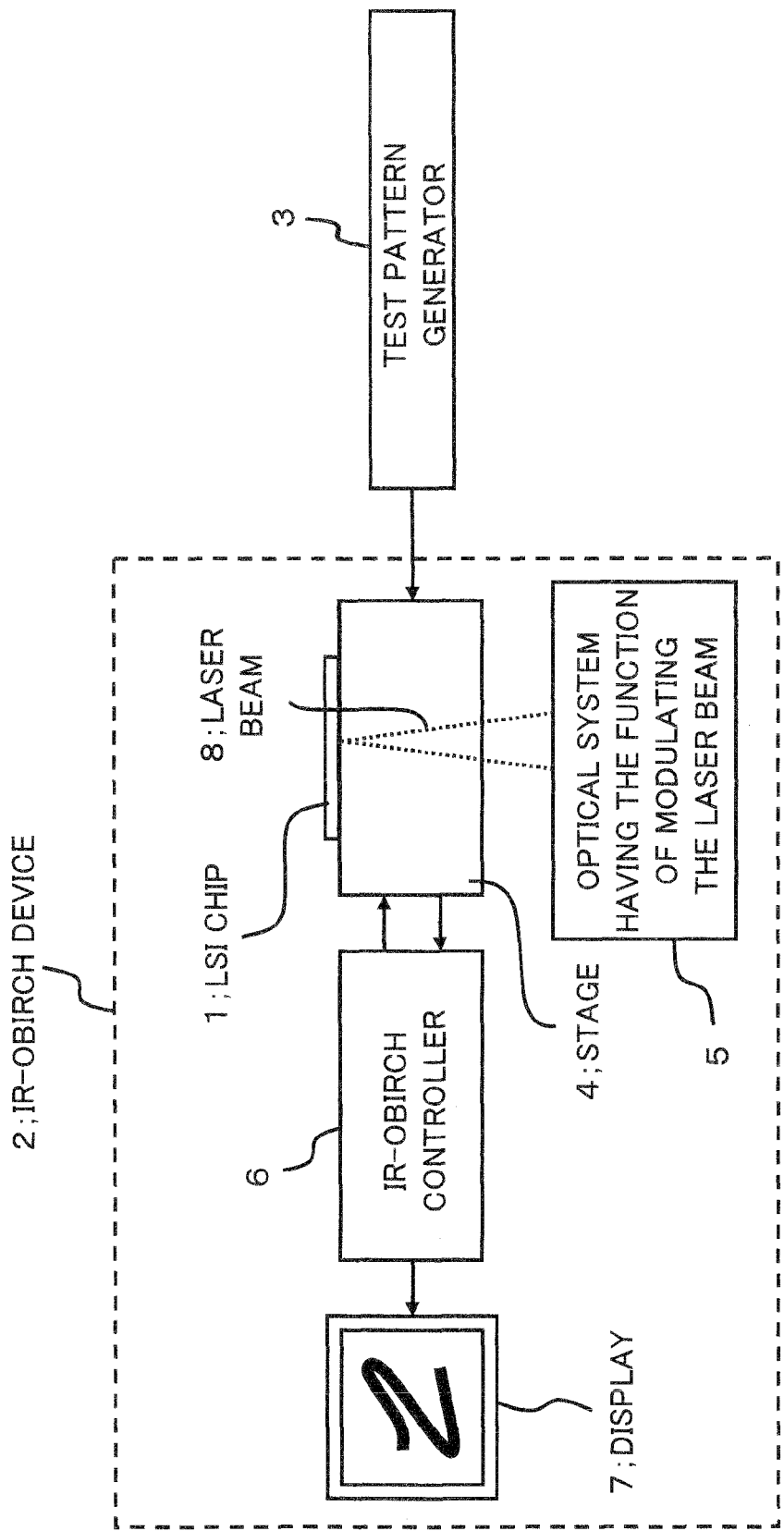
FIG. 1 is a schematic block diagram showing the constitution of an apparatus for inspection and fault analysis according to a first exemplary embodiment of the present invention.

If, in the method for inspection and fault analysis according to the present invention, there is no abnormal current route, it is preferred to carry out a step of delivering another test pattern different from the initially delivered test pattern to the semiconductor chip. Preferably, the step of visualizing resistance changes of the semiconductor chip is carried out at the time of delivering the other test pattern.

In the above method for inspection and fault analysis according to the present invention, it is preferred that the step of visualizing resistance changes of the semiconductor chip carried out under a first condition. If the presence of the abnormal current route has been determined in the decision giving step, the semiconductor chip may be scanned and illuminated by a laser beam under a second condition for heating the semiconductor chip for visualizing resistance changes in the semiconductor chip. After carrying out the step of visualizing the resistance changes in the semiconductor chip under the second condition, a step of detecting a defect and an abnormal current route conducting an abnormal IDDQ in the semiconductor chip may be carried out, based on the image obtained on visualizing resistance changes in the semiconductor chip. Preferably, the first condition is a condition with a higher speed than in the second condition.

In the method for inspection and fault analysis according to the present invention, preferably, the first condition is one of a condition of using a laser beam of a higher modulation frequency than in the second condition, a condition of using a laser beam of a higher scanning speed, and a condition of decreasing the number of pixels of the image per picture image, or a combination thereof.

In the apparatus for detection and fault analysis according to the present invention, the optical system having the function of modulating the laser beam, preferably, operates so that the semiconductor chip is scanned and illuminated by the laser beam during the time the test pattern is delivered by the test pattern generator to the semiconductor chip.

In the apparatus for detection and fault analysis according to the present invention, preferably, the controller confirms the presence or absence of the abnormal current route based on the image signal.

In the apparatus for detection and fault analysis according to the present invention, preferably, the controller controls the test pattern generator to switch from outputting the test pattern to outputting another different test pattern in case of the absence of the abnormal current route. The controller subsequently may manage control for taking out a signal from the semiconductor chip through the lock-in amplifier and for correlating the signal thus taken out with scanning point(s).

In the apparatus for detection and fault analysis according to the present invention, the controller, preferably, exercises control for performing the operation of taking out the signal from the semiconductor chip under a first condition, and for performing the operation of taking out the signal from the semiconductor chip under a second condition if, in confirming the presence or the absence of the abnormal current route, the presence of the abnormal current route is confirmed. The controller, preferably, exercises control for image processing for taking out a signal from the semiconductor chip under the second condition, carrying out the image processing of correlating the signal taken out with the scanning point(s), and for subsequently detecting a defect and an abnormal current route conducting the abnormal IDDQ in the semiconductor chip, based on an image signal resulting from the image processing. The first condition may be a condition with a higher speed than in the second condition.

In the apparatus for detection and fault analysis according to the present invention, preferably, the first condition is one of a condition of using a laser beam of a higher modulation frequency than in the second condition, a condition of using a laser beam of a higher scanning speed, and a condition of decreasing the number of pixels per picture image, or a combination thereof.

First Exemplary Embodiment

A method and an apparatus for inspection and fault analysis according to a first exemplary embodiment of the present invention are now described with reference to drawings. FIG. 1 is a schematic block diagram showing the constitution of an apparatus for inspection and fault analysis of the first exemplary embodiment.

An apparatus for inspection and fault analysis of the first exemplary embodiment is used for identifying an abnormal chip in a manufacture process of an LSI chip 1 (semiconductor chip), by way of inspection, and for locating a possible fault site by targeting narrowing to decide a site of fault on the abnormal chip to investigate into the cause of the fault. The apparatus for inspection and fault analysis includes an IR-OBIRCH device 2 and a test pattern generator 3.

The IR-OBIRCH (Infrared Optical Beam induced Resistance Change) device 2 is used for visualizing resistance changes induced on laser beam heating, and includes a stage 4, an optical system 5, provided with the function of modulating a laser beam, an IR-OBIRCH controller 6 and a display 7. As for the IR-OBIRCH device, reference is made to Patent Document 1 and Non-Patent Document 1, the entire disclosures thereof being herein incorporated by reference thereto.

The stage 4 is a table on which to set the LSI chip 1 as a sample. The stage 4 is electrically connected to the test pattern generator 3 and receives a test pattern from the latter to output the test pattern received to the LSI chip 1. The stage 4 is configured so that a laser beam 8 from the optical system 5 provided with the function of modulating a laser beam will illuminate the back surface of the LSI chip 1. The stage 4 is electrically connected to and controlled in its operation by the IR-OBIRCH controller 6.

The optical system 5 provided with the function of modulating a laser beam is an optical device operating so that the LSI chip 1 is scanned and illuminated by the modulated laser beam 8. The optical system 5 provided with the function of modulating a laser beam is controlled in its operation by the IR-OBIRCH controller 6.

The IR-OBIRCH controller 6 controls the respective components of the IR-OBIRCH device 2. The IR-OBIRCH controller 6 mounts a lock-in amplifier, not shown, for taking out only a signal of a preset frequency in an output signal of the LSI chip 1. The IR-OBIRCH controller 6 takes out the modulated OBIRCH signal, from the signal from the LSI chip 1, by the lock-in amplifier, and performs image processing for correlating the OBIRCH signal, thus taken out, with scanning points. An image signal, corresponding to the so processed IR-OBIRCH image, is output to the display 7. The IR-OBIRCH controller 6 checks to see whether or not there is an abnormal current route, based on the image signal corresponding to the IR-OBIRCH image. If it has been verified that there exists the abnormal current route, the IR-OBIRCH controller 6 recognizes that the chip is the IDDQ abnormal chip. If it has been verified that there does not exist the abnormal current route, the IR-OBIRCH controller 6 controls the test pattern generator 3 to switch to outputting another test pattern.

The display 7 displays an image based on the image signal from the IR-OBIRCH controller 6.

The test pattern generator 3 generates a test pattern (signal) for testing the LSI chip 1.

Figure 2:
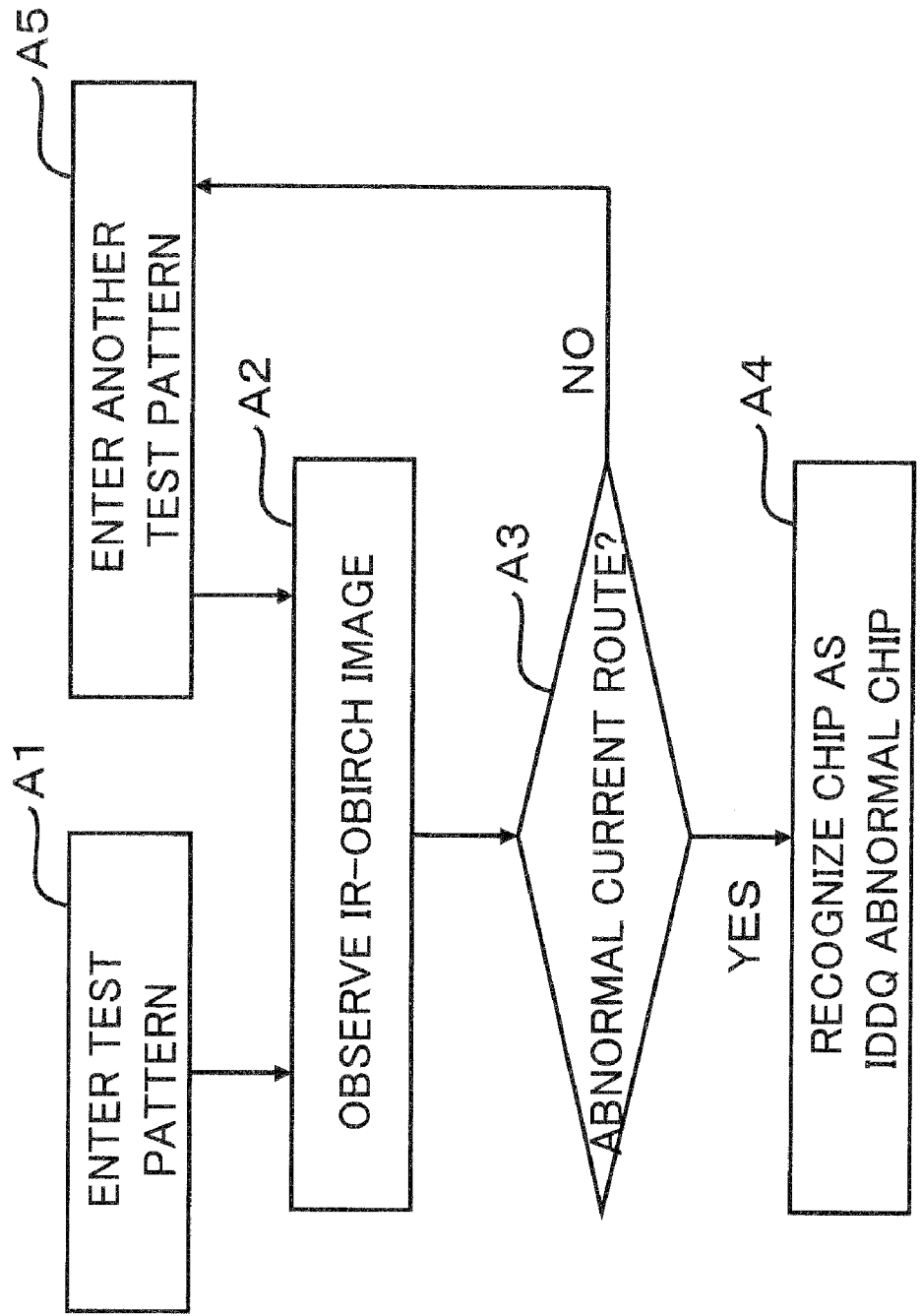
FIG. 2 is a flowchart for schematically illustrating the operation of the apparatus for inspection and fault analysis according to the first exemplary embodiment of the present invention.

The operation of the apparatus for inspection and fault analysis according to the first exemplary embodiment of the present invention is now described with reference to the drawings. FIG. 2 depicts a flowchart for schematically illustrating the operation of the apparatus for inspection and fault analysis according to the present first exemplary embodiment. FIG. 3 depicts a schematic view for illustrating the operation of the apparatus for inspection and fault analysis according to the present first exemplary embodiment.

Referring to FIG. 2, initially, a test pattern is supplied from the test pattern generator 3 via stage 4 to the LSI chip 1 (step A1). An IR-OBIRCH image is visually observed on the IR-OBIRCH device 2 (step A2). To visually observe the IR-OBIRCH image, the optical system 5 having the function of modulating the laser beam scans and illuminates the LSI chip 1 with a modulated laser beam 8. The optical system then takes out the modulated OBIRCH signal, via a lock-in amplifier of the IR-OBIRCH controller 6, and performs image processing for correlating the OBIRCH signal, thus taken out, with the scanning points. The optical system then displays the IR-OBIRCH image on the display 7, based on the image-processed image signal.

The optical system then verifies whether or not there is an abnormal current route in the IR-OBIRCH image displayed (step A3). The decision on whether or not there is an abnormal current route is given in dependence upon whether or not there exists a contrast indicating the presence of an abnormal current route 10 in the IR-OBIRCH image. For example, referring to FIG. 3, there is no contrast in the IR-OBIRCH image of a normal chip. Conversely, with the abnormal chip, there is presented a contrast, indicating the abnormal current route 10, in the IR-OBIRCH image. Thus, the difference between the normal and abnormal chips may be noticed both in case of the larger IDDQ value and in case of the smaller IDDQ value. However, in the case of the larger IDDQ value of the normal chip, laser modulation and signal takeout by the lock-in amplifier are indispensable for improving the S/N ratio.

If it is determined that there is an abnormal current route (YES of step A3), the chip is determined to be an IDDQ abnormal chip (step A4).

If it is determined that there is no abnormal current route (NO of step A3), the test pattern is switched to another test pattern, which is entered (step A5). The steps A2 and A3 are repeated until a decision is given that there is an abnormal current route (YES of step A3).

Although it is presumed that the steps A3 to A5 are carried out by an automatic operation by the IR-OBIRCH controller, these steps may also be carried out by a manual operation.

With the first exemplary embodiment, an abnormal chip, for which it has been difficult to identify as being an IDDQ abnormal chip, may readily be identified as such. That is, even in case of a large power supply current of a normal chip, it becomes possible to identify a given chip as being a normal chip or an abnormal chip. Further, the LSI tester, which it is necessary to use in the related art (comparative) examples 1 and 2, may be dispensed with, and an inexpensive test pattern generator may be used, thus enabling low cost testing. Additionally, the step of identifying an IDDQ abnormal chip and the step of detecting the abnormal current route and the defect may be carried out simultaneously, with the result that the IR-OBIRCH image may be observed efficiently.

Second Exemplary Embodiment

Figure 4:
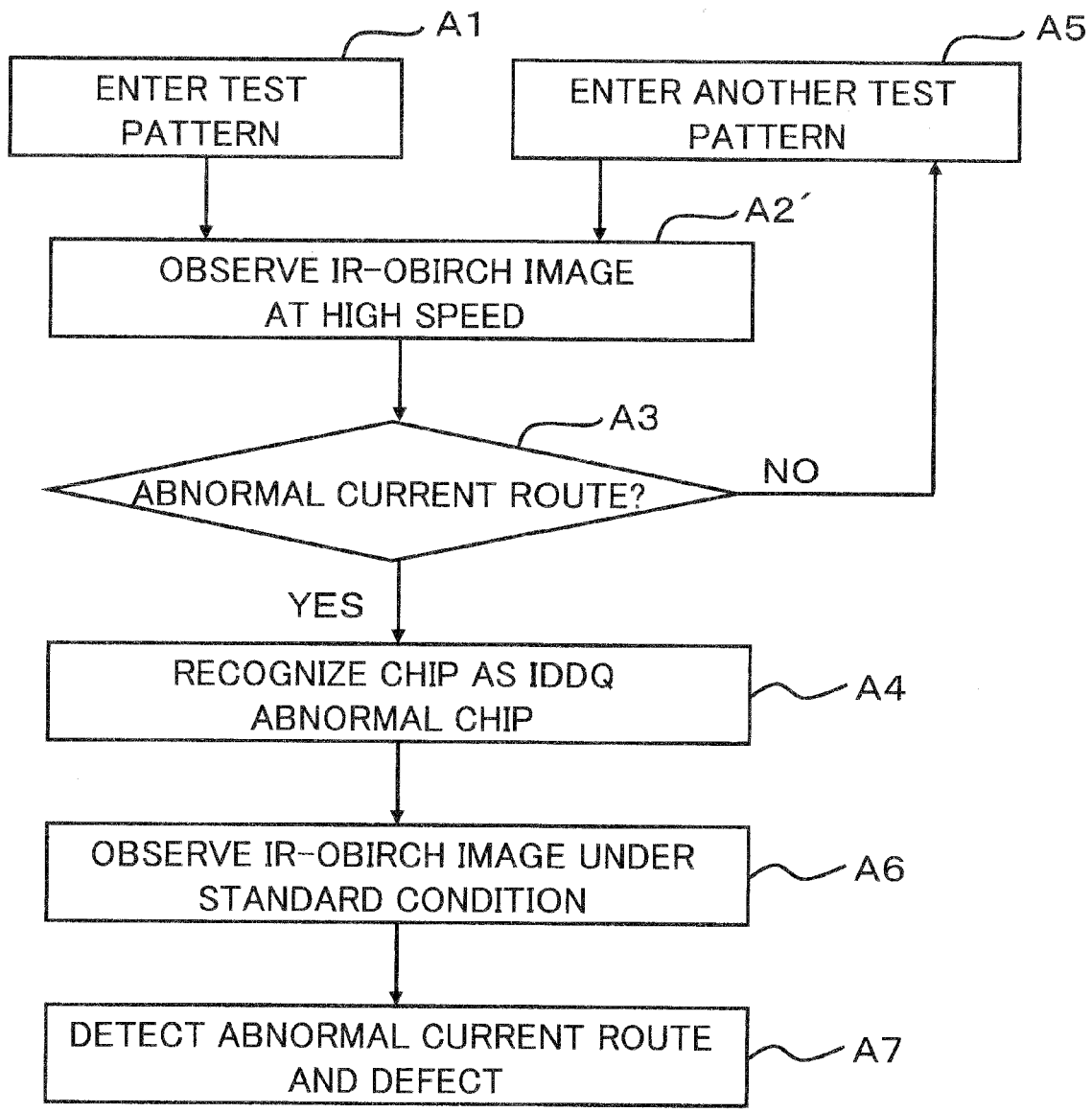
FIG. 4 is a flowchart schematically illustrating the operation of an apparatus for inspection and fault analysis according to a second exemplary embodiment of the present invention.
Figure 7:
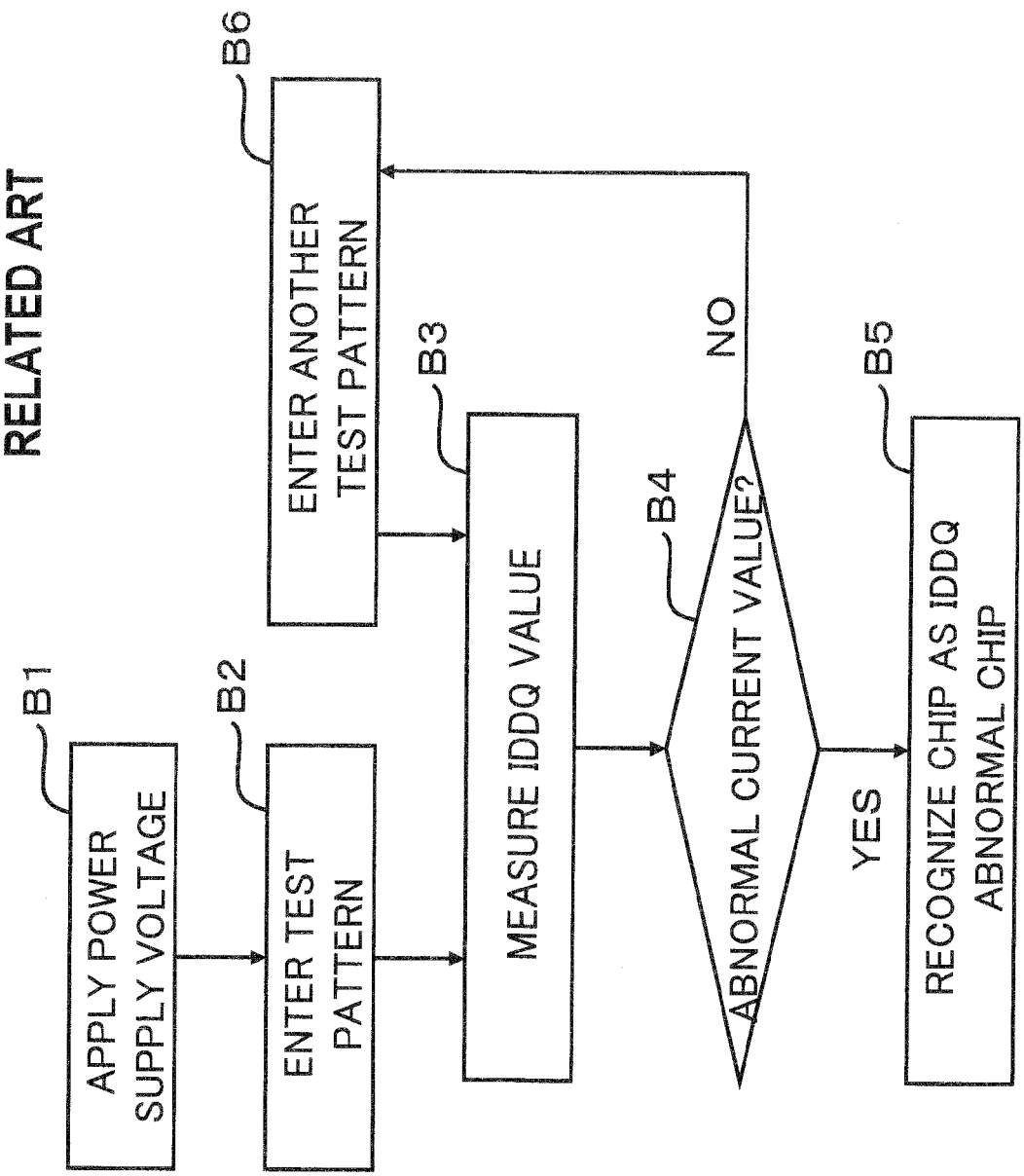
FIG. 7 is a flowchart schematically illustrating the operation of the apparatus for inspection and fault analysis according to the related art example 1.
Figure 8A:
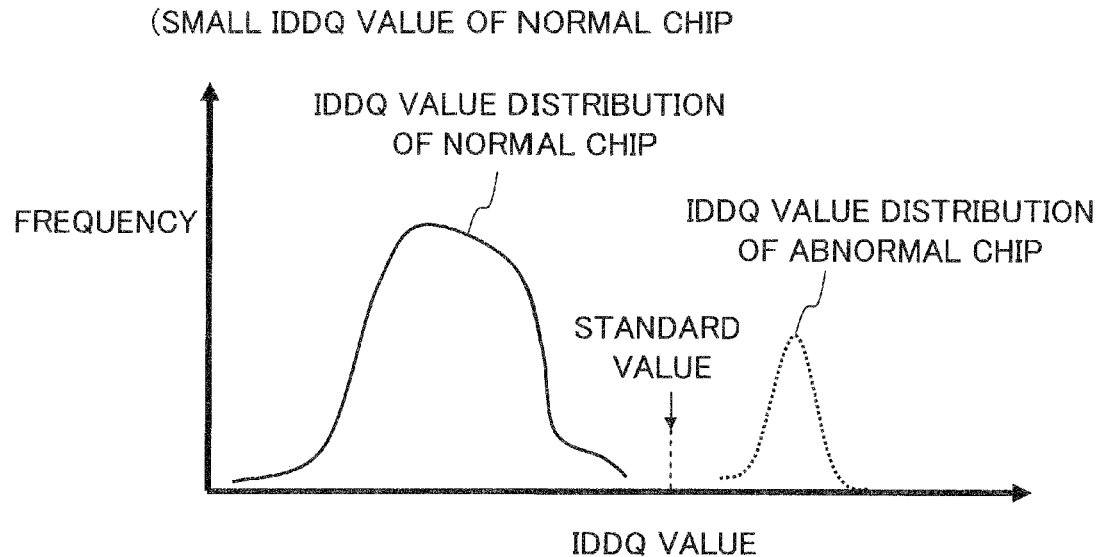
FIGS. 8(A) and 8(B) are graphs showing IDDQ value distribution for illustrating the problems of the related art example 1 for smaller and larger IDDQ values of the normal chip, respectively.
Figure 8B:
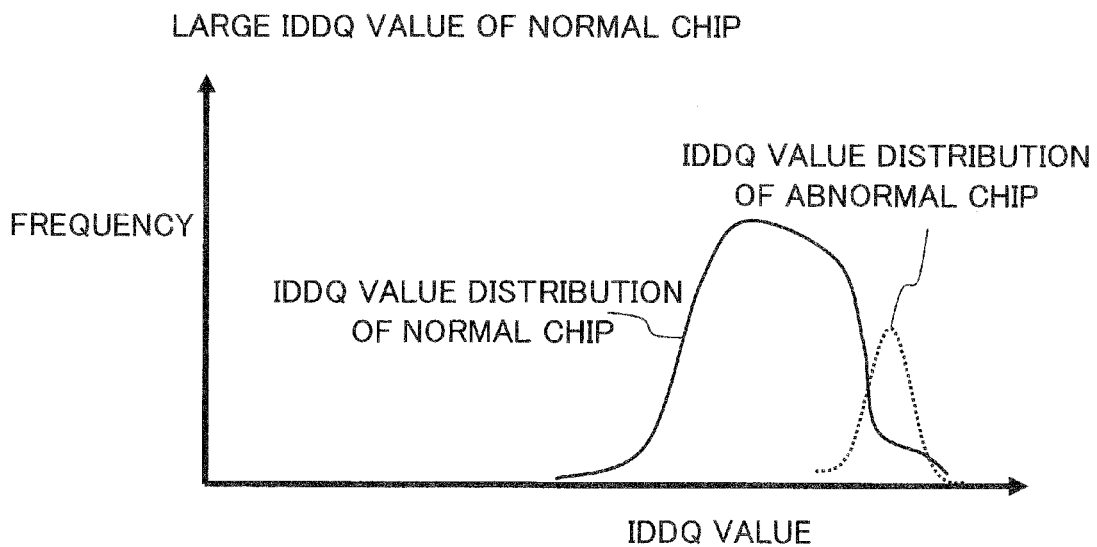
Figure 9:
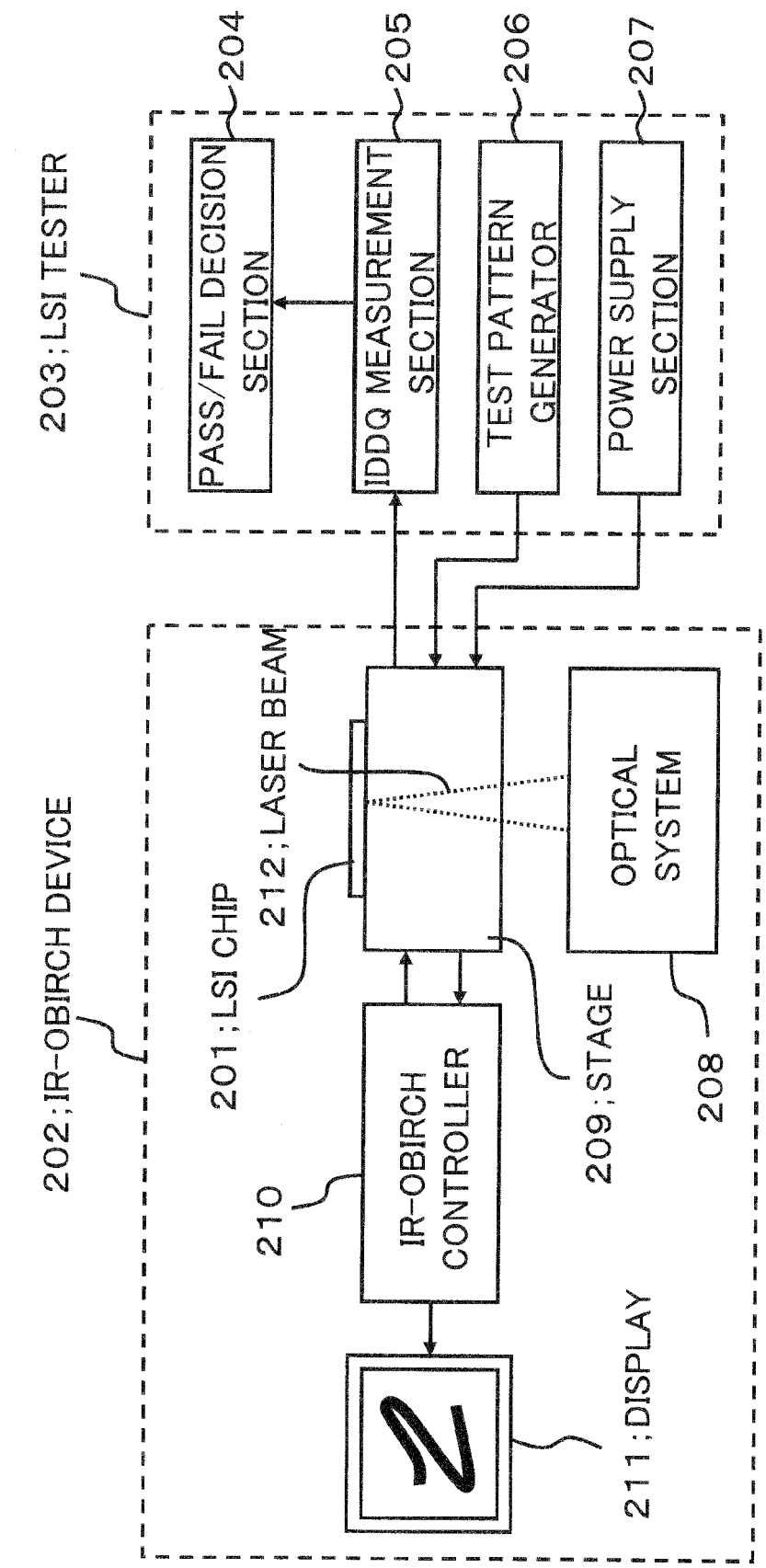
FIG. 9 is a block diagram schematically showing the operation of the apparatus for inspection and fault analysis according to a related art (comparative) example 2.
Figure 10:
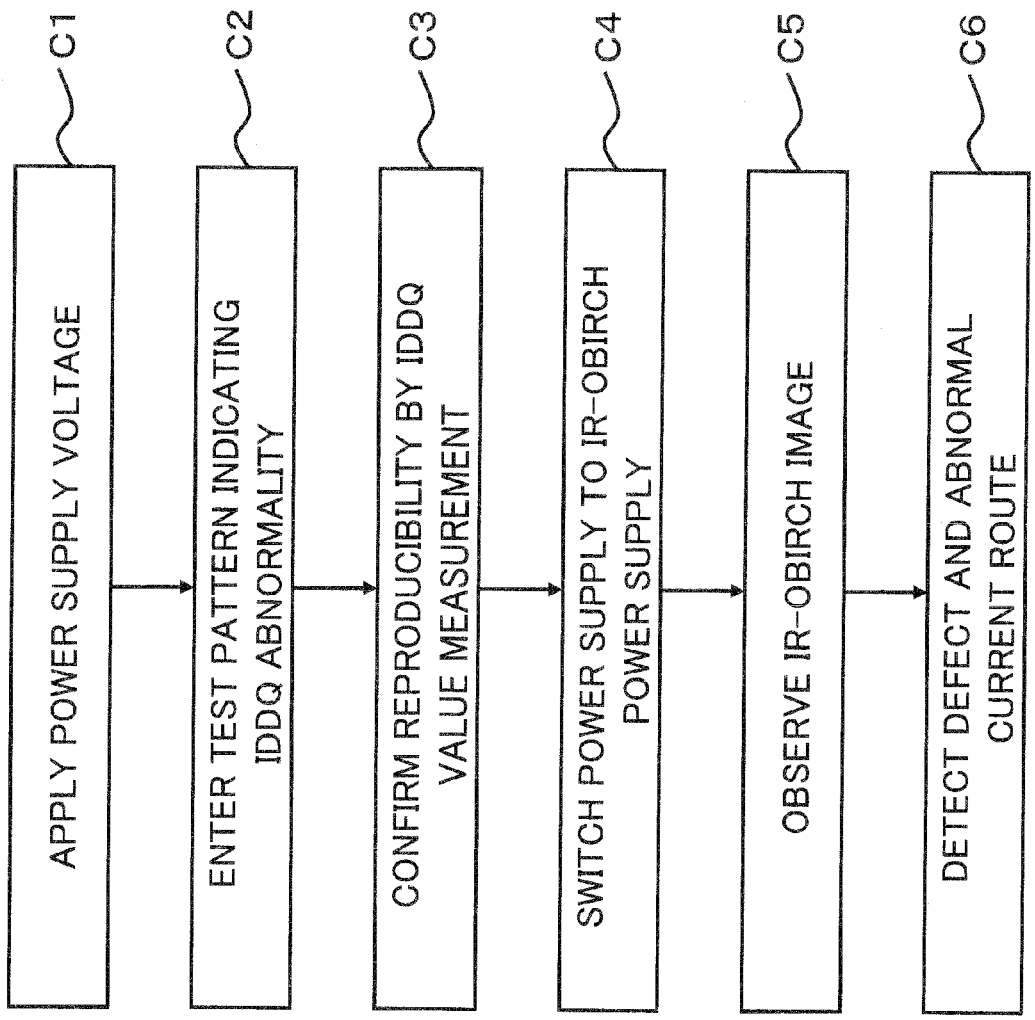
FIG. 10 is a flowchart schematically showing the operation of the apparatus for inspection and fault analysis according to a related art (comparative) example 2.

The method and apparatus for inspection and fault analysis according to a second embodiment of the present invention are now described with reference to the drawings. FIG. 4 depicts a flowchart schematically showing the operation of an apparatus for inspection and fault analysis according to the second exemplary embodiment of the present invention. FIGS. 5(A) and 5(B) are schematic views showing IR-OBIRCH images acquired with the apparatus for inspection and fault analysis according to the present second exemplary embodiment. Specifically, FIG. 5(A) shows the image acquired under a standard condition for acquisition and FIG. 5(B) shows the image acquired under a high-speed condition for acquisition. See FIG. 1 as to the constitution of the apparatus for inspection and fault analysis according to the second exemplary embodiment.

In the method and apparatus for inspection and fault analysis according to the present second exemplary embodiment, an apparatus similar to the apparatus for inspection and fault analysis according to the first exemplary embodiment is used. However, the possible presence of the abnormal current route in a chip is verified readily using an IR-OBIRCH image observed at a high speed and, if there is an abnormal current route in the chip, an IR-OBIRCH image is observed under a standard condition similar to that used in the first exemplary embodiment to detect an abnormal current route and a defect more accurately.

Initially, a test pattern is entered to the LSI chip 1, via stage 4, using the pattern generator 3 (step A1), and an IR-OBIRCH image is observed at a high speed by the IR-OBIRCH device 2 (step A2').

Meanwhile, the IR-OBIRCH image may be observed as mentioned in detail with reference to the first exemplary embodiment. The point of difference is that the IR-OBIRCH image is observed at a 'high speed'. To observe the image at a high speed, (1) the frequency of modulation is elevated, (2) the scanning speed is raised, or (3) the number of pixels per picture image is decreased.

Under the standard condition, scanning is performed so that a pixel of an image will be acquired within a time on the order of ten periods corresponding to the modulation frequency. For example, if modulation is with 10 kHz, the period is 100 μs. Hence, the time within which a pixel is to be obtained is set to approximately 1 ms, and the time constant of the lock-in amplifier is set to approximately 1 ms. Under this condition, a picture image of 1000 pixels by 1000 pixels is obtained within a time of the order of 1000 seconds.

It is assumed that, to obtain an image at a high speed, with the above standard condition as reference, (1) the method of raising the modulation frequency is used. It is also assumed that, in this case, modulation is with 100 kHz, for example, and a pixel is obtained within approximately 100 μs corresponding to ten periods. To obtain a picture image of 1000 pixels by 1000 pixels, approximately 100 seconds are needed, meaning that an image may be obtained within a time of the order of one-tenth of that under the standard condition.

(2) It is assumed that the method of raising the scanning speed is used. If modulation is with a frequency of 10 kHz, for example, and a pixel is obtained within approximately 100 μs corresponding to the period of 100 μs for the modulation frequency, a picture image of 1000 pixels by 1000 pixels may again be obtained within approximately 100 seconds, which is on the order of one-tenth of that obtained under the standard condition.

(3) It is assumed that the method of decreasing the number of pixels per picture image is used. It is also assumed that modulation is with a frequency of 10 kHz, for example, and a pixel is obtained within about 1 ms corresponding to ten periods. In this case, a picture image of 300 pixels by 300 pixels may again be acquired within time of the order of 100 seconds, which is on the order of one-tenth of that obtained under the standard condition.

If the above methods (1) to (3) are combined in such a manner that modulation is with 100 kHz, a pixel is acquired within about 10 μs corresponding to its period and a picture image of 300 pixels by 300 pixels is to be acquired, a picture image may be acquired within about one second.

If a picture image may be acquired at such a high speed, inspection may be carried out within a time interval approximately equal to that in case of measurement with an LSI tester. Of course, if a picture image is acquired under such adverse conditions, the image produced is lowered in quality. It is however sufficient if the condition is set so that it can barely be determined whether a chip is a normal chip or an abnormal chip.

FIG. 5(A) depicts an IR-OBIRCH image of a normal chip and an IR-OBIRCH image of an abnormal chip, both of which have been acquired under a standard condition. Although the contrast is not noticed with the normal chip, the abnormal current route 10 may definitely be noticed with the abnormal chip. FIG. 5(B) depicts an IR-OBIRCH image of a normal chip and an IR-OBIRCH image of an abnormal chip, both of which have been acquired under a high speed condition. It is seen that contrast may not be noticed with the normal chip, as above. With the abnormal chip, a contrast 11 ascribable to the abnormal current route may be seen in a somewhat blurred state. Granting that the abnormal current route 10 cannot be detected under the high speed condition, such is not obstructive in identifying an abnormal chip.

It is then checked whether or not there is an abnormal current route in the IR-OBIRCH image displayed (step A3), in which the IR-OBIRCH image displayed may be blurred. If it is determined that there is an abnormal current route (YES of step A3), the chip is recognized to be an IDDQ abnormal chip (step A4). If it is determined that there is no abnormal current route (NO of step A3), the test pattern, thus far used, is switched to another test pattern, which is then entered (step A5). The steps A2' and A3 are repeated until it is determined that there is an abnormal current route (YES of step A3).

If it is determined that a chip being tested is an IDDQ abnormal chip (step A4), an IR-OBIRCH image is observed under the standard condition (step A6) and, based on the results, an abnormal current route or a defect is detected (step A7)

With the second exemplary embodiment, in which high-speed observation is combined with normal observation, an IDDQ abnormal chip can be identified even in case of a large IDDQ value of the normal chip. In addition, the speed of identifying an IDDQ abnormal chip may be made higher. Also, an LSI tester, needed in the related art examples 1 and 2, may be dispensed with, and an inexpensive test pattern generator may be used, thus enabling inspection and fault analysis at a lower cost.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for inspection and fault analysis, comprising:
    delivering a test pattern as an input to a semiconductor chip;
    at the time of delivering said test pattern as an input, scanning and illuminating said semiconductor chip with a laser beam, so that said semiconductor chip is heated;
    generating an image to visualize resistance changes in said semiconductor chip resulting from said scanning and illuminating step; and
    determining a presence or absence of an abnormal current route, based on said image generated in said generating step,
    wherein said steps of scanning and illuminating said semiconductor chip and generating an image are carried out under a first condition,
    wherein, if the presence of said abnormal current route has been determined in said determining step, a second scanning and illuminating step is conducted upon said semiconductor chip under a second condition and a second image is generated for visualizing resistance changes in said semiconductor chip under said second condition, and
    wherein, after carrying out said step of generating a second image under said second condition, a second determining step is carried out for detecting a presence or absence of an abnormal current route conducting an abnormal IDDQ in said semiconductor chip based on said second image,
    said first condition being a condition with a higher speed than in said second condition.

2. The method for inspection and fault analysis according to claim 1, further comprising:
    in the event that no abnormal current route is determined in said determining step, delivering another test pattern different from said test pattern as an input;
    at the time of delivering said another test pattern as an input, scanning and illuminating said semiconductor chip with the laser beam; and
    generating another image to visualize resistance changes in said semiconductor chip based on said other test pattern.

3. The method for inspection and fault analysis according to claim 1, wherein said first condition is any of a condition of i) using a laser beam of a higher modulation frequency than in said second condition, ii) a condition of using a laser beam of a higher scanning speed, and iii) a condition of decreasing the number of pixels of said image per picture image.

4. A method for manufacturing a semiconductor device, including the method for inspection and fault analysis according to claim 1.

5. An apparatus for detection and fault analysis, comprising:
    a stage configured to have a semiconductor chip mounted thereon;
    a test pattern generator configured to supply a test pattern to said semiconductor chip via said stage;
    an optical system having a function of modulating a laser beam to scan and illuminate said semiconductor chip mounted on said stage;
    a controller configured to process a signal from said semiconductor chip through a lock-in amplifier, the lock-in amplifier being configured to take out only a signal portion of a preset frequency in the signal from said semiconductor chip, said controller further configured to perform image processing to correlate the signal portion with one or more scanning points to generate an image signal, and to confirm a presence or absence of an abnormal current route based on said image signal; and
    a display section configured to display an image based on the image signal from said controller,
    wherein said controller processes the signal under a first condition, and
    wherein said controller is further configured to, in the event that the abnormal current route is confirmed as present, process a second signal from said semiconductor chip through the lock-in amplifier and perform a second image processing under a second condition, and subsequently determine a presence or absence of a defect and an abnormal current route conducting an abnormal IDDQ in said semiconductor chip based on a second image signal resulting from said second image processing,
    said first condition being a condition with a higher speed than in said second condition.

6. The apparatus for detection and fault analysis according to claim 5, wherein said optical system operates so that said semiconductor chip is scanned and illuminated by a modulated light beam while said test pattern generator is supplying said test pattern to said semiconductor chip.

7. The apparatus for detection and fault analysis according to claim 5, wherein said controller controls said test pattern generator to, in the event that the abnormal current route is not present, switch from outputting said test pattern to outputting another test pattern different therefrom, said controller subsequently processing a second signal from said semiconductor chip through said lock-in amplifier and for correlating the second signal with second one or more scanning points.

8. The apparatus for detection and fault analysis according to claim 5, wherein said first condition is any of i) a condition of using a laser beam of a higher modulation frequency than in said second condition, ii) a condition of using a laser beam of a higher scanning speed, and iii) a condition of decreasing the number of pixels per picture image.

9. An apparatus for detection and fault analysis, comprising:
    a stage configured for receiving a semiconductor chip to be mounted thereon;
    a test pattern generator configured to supply a test pattern to said semiconductor chip via said stage;
    an optical system configured to operationally modulate a laser beam to scan and illuminate the semiconductor chip mounted in the stage;
    a controller including a lock-in amplifier, configured to perform a first processing on a signal output from said semiconductor chip via the lock-in amplifier under a first condition, the lock-in amplifier being configured to process only a signal portion of a preset frequency in the signal output from said semiconductor chip, said controller configured to perform a first image processing to correlate the signal portion with one or more scanning points to generate a first image signal, and to determine a presence of an abnormal current route based on said first image signal, said controller further configured to, on determining a presence of the abnormal current route, perform a second processing on the signal output from said semiconductor chip under a second condition, generate a second image signal, and subsequently determine a presence of an abnormal IDDQ in said semiconductor chip based on the second image signal; and a display section configured to display an image based on any of the first and second image signals generated by said controller, wherein said first condition is a condition having a higher speed than in said second condition.

10. The apparatus according to claim 9, wherein said first condition is any of i) a condition of using a laser beam of a higher modulation frequency than in said second condition, ii) a condition of using a laser beam of a higher scanning speed than in said second condition, and iii) a condition of decreasing the number of pixels per picture image than in said second condition.

11. The apparatus according to claim 9, wherein said controller controls the optical system and said test pattern generator so that said semiconductor chip is scanned and illuminated by a modulated light beam while said test pattern generator supplies said test pattern to said semiconductor chip.

12. The apparatus according to claim 9, wherein said controller controls said test pattern generator to, in the event that the abnormal current route is not determined present, control said test pattern generator to generate another test pattern, said controller configured to subsequently conduct another processing on another signal from said semiconductor chip through said lock-in amplifier and generate another image signal based on said another test pattern.

* * * * *